(12) United States Patent
Kuwatsuka

(10) Patent No.: US 6,885,039 B2
(45) Date of Patent: Apr. 26, 2005

(54) SEMICONDUCTOR PHOTODETECTOR AND AVALANCHE PHOTODIODE

(75) Inventor: Haruhiko Kuwatsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/694,794

(22) Filed: Oct. 29, 2003

(65) Prior Publication Data

US 2004/0089876 A1 May 13, 2004

(30) Foreign Application Priority Data

Oct. 30, 2002 (JP) .................................. 2002-316506
Jun. 12, 2003 (JP) .................................. 2003-167793

(51) Int. Cl.[7] .............................................. H01L 21/00
(52) U.S. Cl. ...................... 257/186; 257/432; 257/433; 257/435; 257/437; 257/438; 257/185; 257/187; 438/48; 438/91
(58) Field of Search .......................... 257/21, 186, 185, 257/191, 438, 192

(56) References Cited

U.S. PATENT DOCUMENTS 5,457,327 A * 10/1995 Taguchi ....................... 257/21
5,543,629 A * 8/1996 Nakamura et al. ........... 257/21

FOREIGN PATENT DOCUMENTS

| JP | 10-209486 | 8/1998 |
| JP | 2996943 | 10/1999 |
| JP | 11-354827 | 12/1999 |
| JP | 3074574 | 6/2000 |

OTHER PUBLICATIONS

R. B. Emmons; "Avalanche–Photodiode Frequency Response"; *Journal of Applied Physics*; vol. 38; No. 9; Aug. 1967; pp. 3705–3714./Discussed in the specification.

* cited by examiner

*Primary Examiner*—Nathan J. Flynn
*Assistant Examiner*—Fazli Erdem
(74) *Attorney, Agent, or Firm*—Armstrong, Kratz, Quintos, Hanson & Brooks, LLP

(57) ABSTRACT

There is provided a semiconductor photodetector which comprises (i) an InP substrate(1), (ii) an optical waveguide (5) having an N-type semiconductor layer(32) formed on the InP substrate(1), an optical waveguide core layer(3) formed on a partial area of the N-type semiconductor layer(32), and an upper cladding layer(4) formed on the optical waveguide core layer(3), and (iii) an avalanche photodiode(17) constructed by forming a photo absorbing layer(33), a heterobarrier relaxing layer(34), an underlying layer(14a) of a N-type field dropping layer(35), an overlying layer(14b) of the N-type field dropping layer(35), a carrier multiplying layer(36), and a P-type semiconductor layer(37) in sequence on another area of the N-type semiconductor layer(32), and coupled to the optical waveguide(5), wherein a side surface of the underlying layer(14a) of the N-type field dropping layer(35) comes into contact with a side surface of the optical waveguide core layer(3), and a part of the overlying layer(14b) of the N-type field dropping layer(35) is formed on the optical waveguide core layer(3).

8 Claims, 21 Drawing Sheets

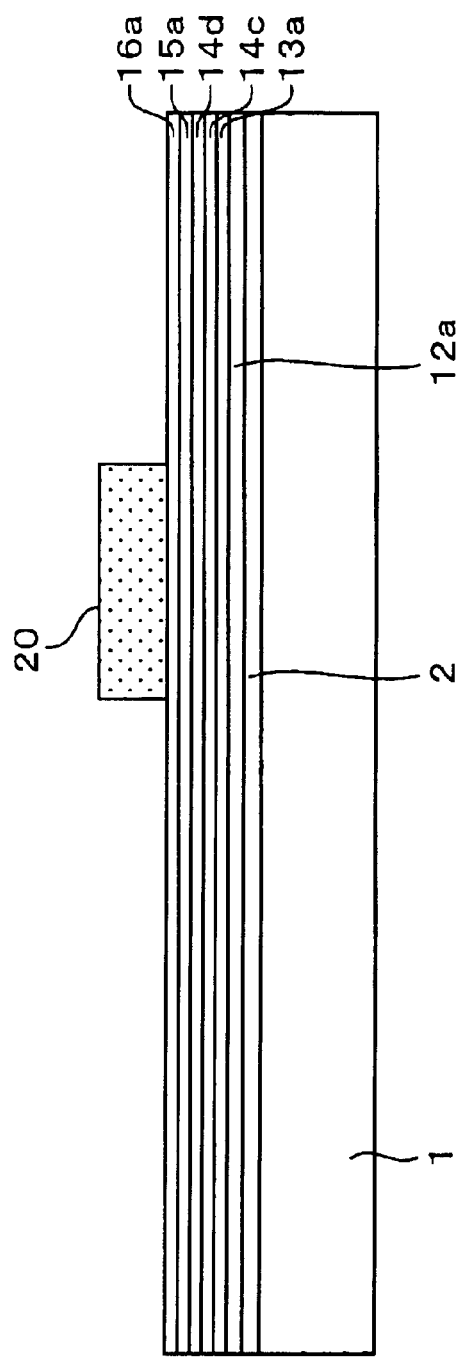
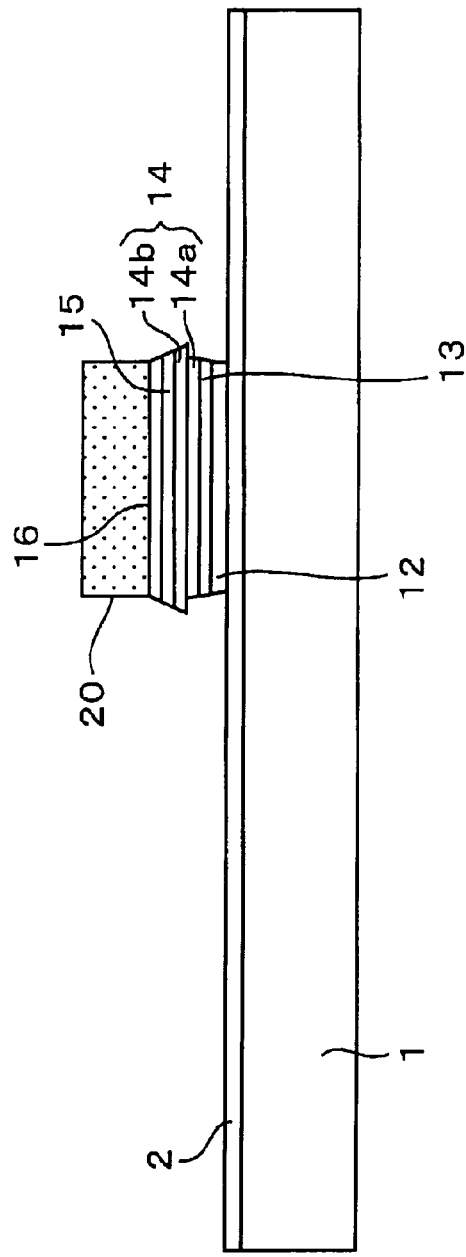
FIG. 4A
FIG. 4B

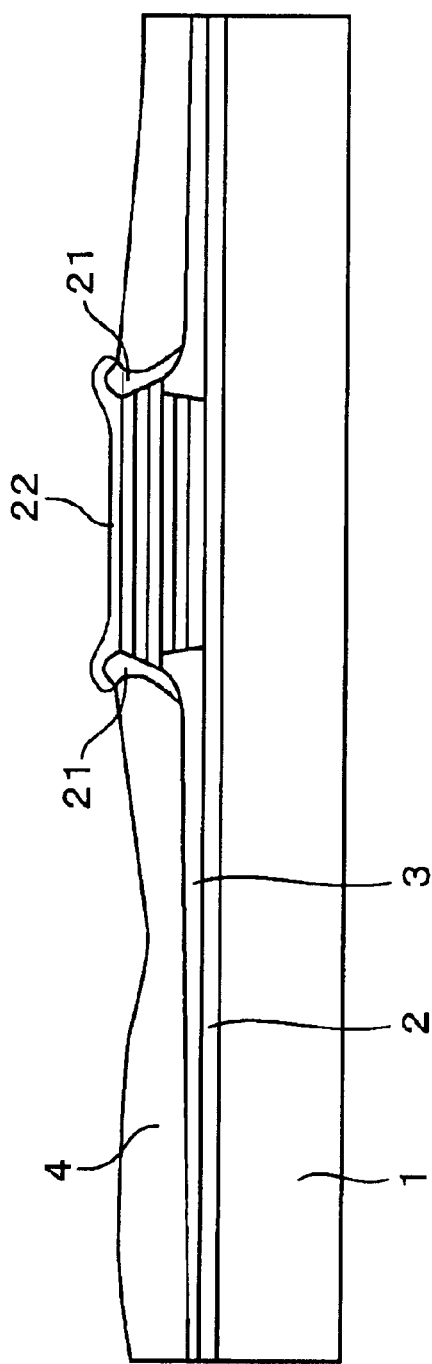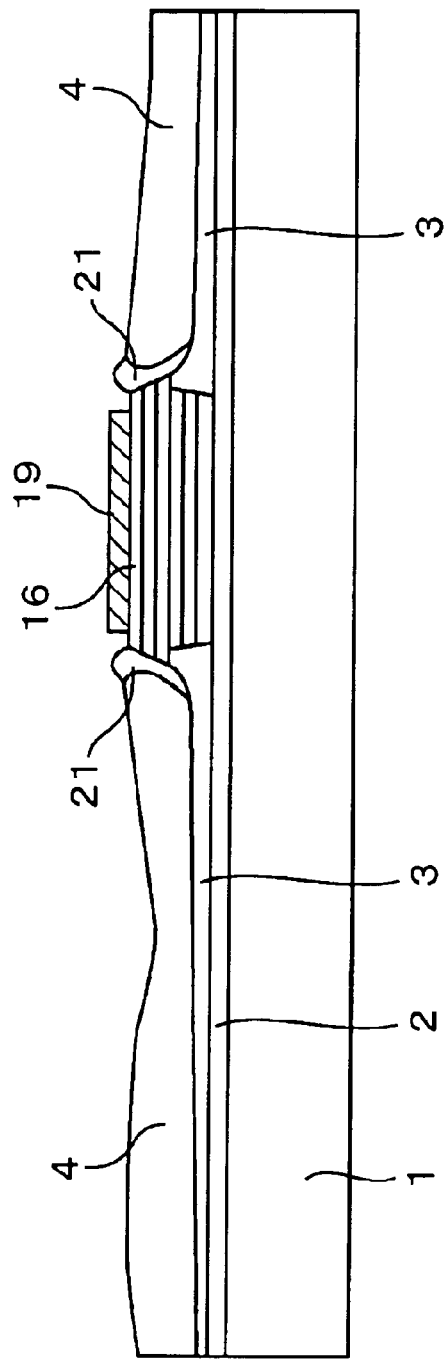

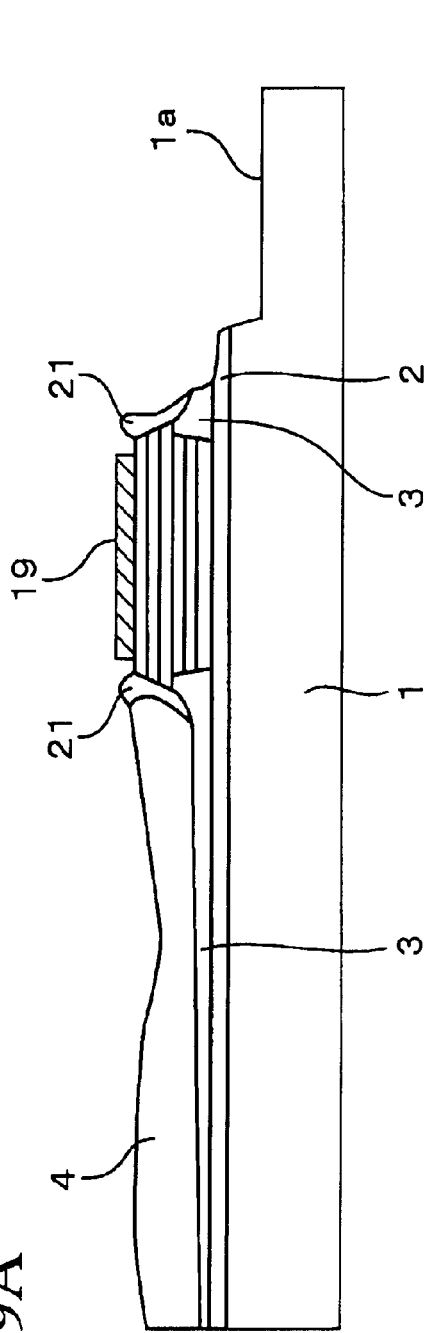
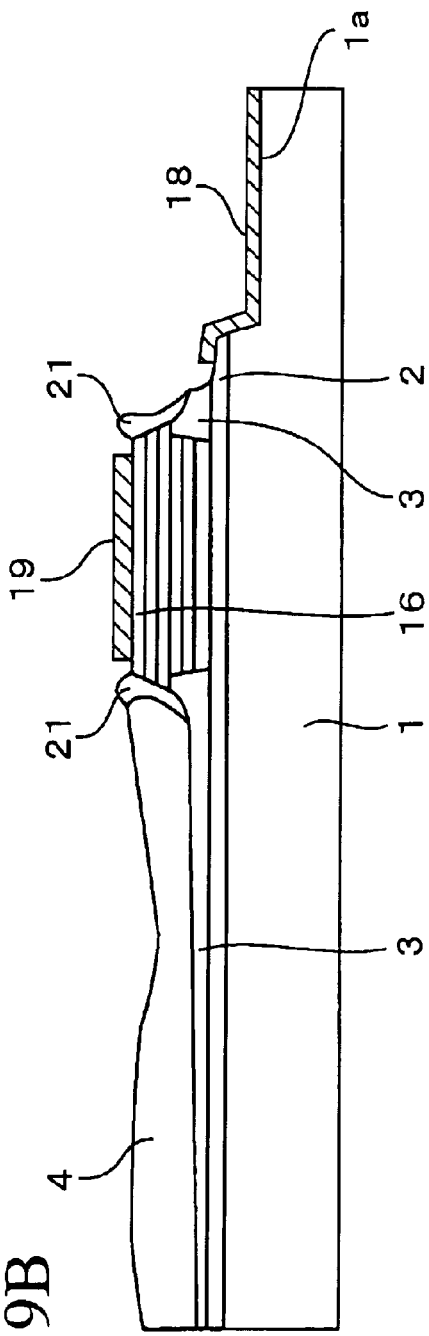
FIG. 9A
FIG. 9B

Film Thickness of the Carrier Multiplying Layer 36 ($\mu$ m)

Film Thickness of the
Photo Absorbing Layer 33 (μm)

SEMICONDUCTOR PHOTODETECTOR AND AVALANCHE PHOTODIODE

CROSS-REFERENCE TO RELATED APPLICATIONS

This application is based upon and claims priority of Japanese Patent Applications No. 2002-316506, filed on Oct. 30, 2002, and No. 2003-167793, filed on Jun. 12, 2003, the contents being incorporated herein by reference.

BACKGROUND OF THE INVENTION

1. Field of the Invention

The present invention relates to a semiconductor photodetector and an avalanche photodiode, which are employed in a high-speed optical communication, etc.

2. Description of the Prior Art

A sectional structure of a semiconductor photodetector for the very high-speed optical communication in the prior art is shown in FIG. 1.

In the structure in FIG. 1, an N-type semiconductor layer 2 made of N-type InP, an optical waveguide core layer 3 made of undoped InGaAsP, and an upper cladding layer 4 made of undoped InP are formed in this sequence on a predetermined region of an undoped InP substrate 1, and these layers constitute an optical waveguide 5. Then, a photo absorbing layer 6 made of undoped InGaAs and a P-type semiconductor layer 7 made of P-type InP are formed in this sequence on the N-type semiconductor layer 2 located near an end portion of the optical waveguide 5, these layers as well as the N-type semiconductor layer 2 constitute a PIN photodiode 8.

In this semiconductor photodetector, in order to attain a sufficient quantum efficiency in the photo absorbing layer 6 whose thickness is thin, the light emitted from the optical waveguide core layer 3 is incident upon the photo absorbing layer 6 from the parallel direction to the jointed surface between the N-type semiconductor layer 2 and the photo absorbing layer 6. Assume that such structure is referred to as a "lateral-type incident structure" hereinafter. Such structure, although not disclosed, is set forth in Japanese Patent Application No.2002-214408.

Then, when the light is input in the state that a reverse bias voltage is applied to an N-side electrode 9 and a P-side electrode 10, pairs of electron-hole are produced in the photo absorbing layer 6 and thus a photo current is sensed.

In this case, as the photodiode, in addition to the above PIN photodiode, the avalanche photodiode (APD) set forth in Patent Literature 1 is also known. In addition, not the lateral-type incident structure but the planar-type avalanche photodiode having the guard ring structure is disclosed in Patent Literature 2, for example. Then, the operating characteristic of the avalanche photodiode is disclosed in Non-Patent Literature 1.

[Patent Literature 1]
Patent Application Publication (KOKAI) Hei 11-354827
[Patent Literature 2]
Patent Application Publication (KOKAI) Hei 10-209486
[Non-Patent Literature 1]
R. B. Emmons, J. Appl. Phys. 38, 3705, 1967

In the semiconductor photodetector having the lateral-type incident structure, it is desired that the further large photo current should be extracted and also the receiving sensitivity should be enhanced. For this reason, it is preferable that the photodiode that is different from the PIN photodiode 8 should be employed.

Further, in such avalanche photodiode, it is preferable that not only simply the receiving sensitivity can be increased but also an operation at a high speed should be performed in a manner such that the light signal being modulated at a high speed can be received and then the photo current that follows up such light signal can be obtained.

SUMMARY OF THE INVENTION

The present invention has been made in light of the problems in the prior art, and it is an object of the present invention to provide a semiconductor photodetector capable of extracting a photo current that is larger than that in the prior art and having a high receiving sensitivity.

Also, it is another object of the present invention to provide an avalanche photodiode capable of operating at a speed that is higher than that in the prior art.

According to an aspect of the present invention, there is provided a semiconductor photodetector which comprises a semiconductor substrate; an optical waveguide having a first conductivity type semiconductor layer formed on the semiconductor substrate, an optical waveguide core layer formed on a partial area of the first conductivity type semiconductor layer, and an upper cladding layer formed on the optical waveguide core layer; and an avalanche photodiode constructed by forming a photo absorbing layer, a heterobarrier relaxing layer, an underlying layer of a first conductivity type field dropping layer, an overlying layer of the first conductivity type field dropping layer, a carrier multiplying layer, and a second conductivity type semiconductor layer in sequence on another area of the first conductivity type semiconductor layer, and coupled to the optical waveguide; wherein a side surface of the underlying layer of the first conductivity type field dropping layer comes into contact with a side surface of the optical waveguide core layer, and a part of the overlying layer of the first conductivity type field dropping layer is formed on the optical waveguide core layer.

Next, advantages of the present invention will be explained hereunder.

According to the present invention, the semiconductor photodetector having the lateral-type incident structure is provided with the avalanche photodiode (APD) having the larger multiplication factor than the PIN photodiode. Therefore, the photo current that is larger than the case where the PIN photodiode is employed can be extracted and also the receiving sensitivity can be enhanced.

In addition, according to the present invention, the side surface of the underlying layer of the first conductivity type field dropping layer comes into contact with the side surface of the optical waveguide core layer, and a part of the overlying layer of the first conductivity type field dropping layer is formed on the optical waveguide core layer. Therefore, as for the electric field distribution in the depth direction of APD, the electric field is dropped by two layers of the overlying layer and the underlying layer of the first conductivity type field dropping layer near the center portion of APD whereas the dropping of the electric field is caused only by one layer of the overlying layer of the first conductivity type field dropping layer in the cross section including the optical waveguide core layer. As a result, with respect to the value obtained by integrating the electric field with respect to the depth of APD, the value in the cross section including the optical waveguide core layer becomes larger than the value in the cross section around the center portion of APD. Normally, the breakdown voltage of APD is increased higher as the above integral value becomes larger.

Therefore, according to the above, the breakdown voltage becomes high at the edge portion of APD in contrast to the center portion and thus the breakdown at the edge portion of APD is hard to occur.

In addition, composition of the constituent element in the underlying layer of the first conductivity type field dropping layer is changed from its lower surface to its upper surface to cause the underlying layer to function as the heterobarrier relaxing layer. This results in preventing the event that the carrier is trapped by the underlying layer to lower the response speed of the semiconductor photodetector.

Also, according to another aspect of the present invention, there is provided an avalanche photodiode which comprises a semiconductor substrate; a photo absorbing layer formed over the semiconductor substrate and a film thickness of which is set to more than 0.15 µm but less than 0.2 µm; and a carrier multiplying layer formed over the photo absorbing layer and a film thickness of which is set to more than 0.07 µm but less than 0.1 µm.

Next, advantages of the present invention will be explained hereunder.

According to the results of the experiment carried out by the inventors of this application, it was validated that, like the present invention, if the film thickness of the photo absorbing layer is set to more than 0.15 µm but less than 0.2 µm and the film thickness of the carrier multiplying layer is set to more than 0.07 µm but less than 0.1 µm, the value of the MB product of the avalanche photodiode can be increased more largely than the value that is predicted theoretically. If the value of the MB product is increased in this manner, the operating speed of the avalanche photodiode can be accelerated, which can contribute largely to the higher speed of the optical communication.

BRIEF DESCRIPTION OF THE DRAWINGS

FIG. 4 is a sectional view (#1) showing steps of manufacturing the semiconductor photodetector according to the first embodiment of the present invention;

FIG. 8 is a sectional view (#4) showing steps of manufacturing the semiconductor photodetector according to the first embodiment of the present invention;

FIG. 9 is a sectional view (#5) showing steps of manufacturing the semiconductor photodetector according to the first embodiment of the present invention;

DETAILED DESCRIPTION OF THE PREFERRED EMBODIMENTS

Embodiments of the present invention will be explained with reference to the drawings hereinafter.

(First Embodiment)

Prior to the explanation of present embodiments, preliminary matters as the basis of the present invention will be explained hereunder.

In the semiconductor photodetector having the lateral-type incident structure, in order to enhance the receiving sensitivity and extract the large photo current, it may be considered to employ the avalanche photodiode that can have a higher current-amplifying action than the PIN photodiode and can receive the light signal, which is modulated at a high speed, at a high quantum efficiency.

Figure 1:
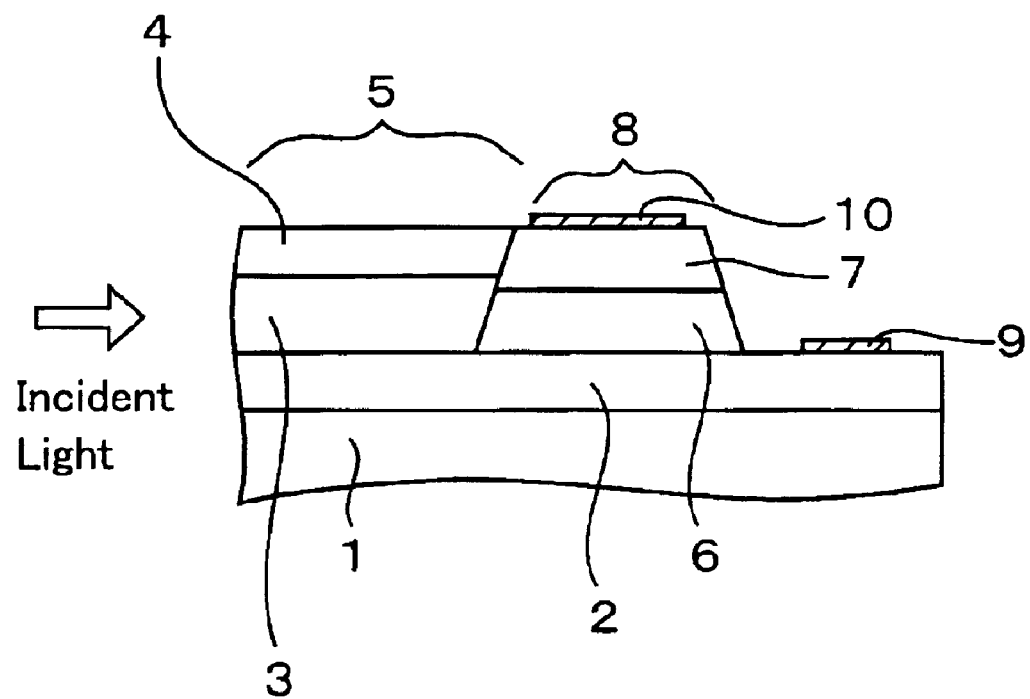
FIG. 1 is a sectional view showing a semiconductor photodetector in the prior art.
Figure 2:
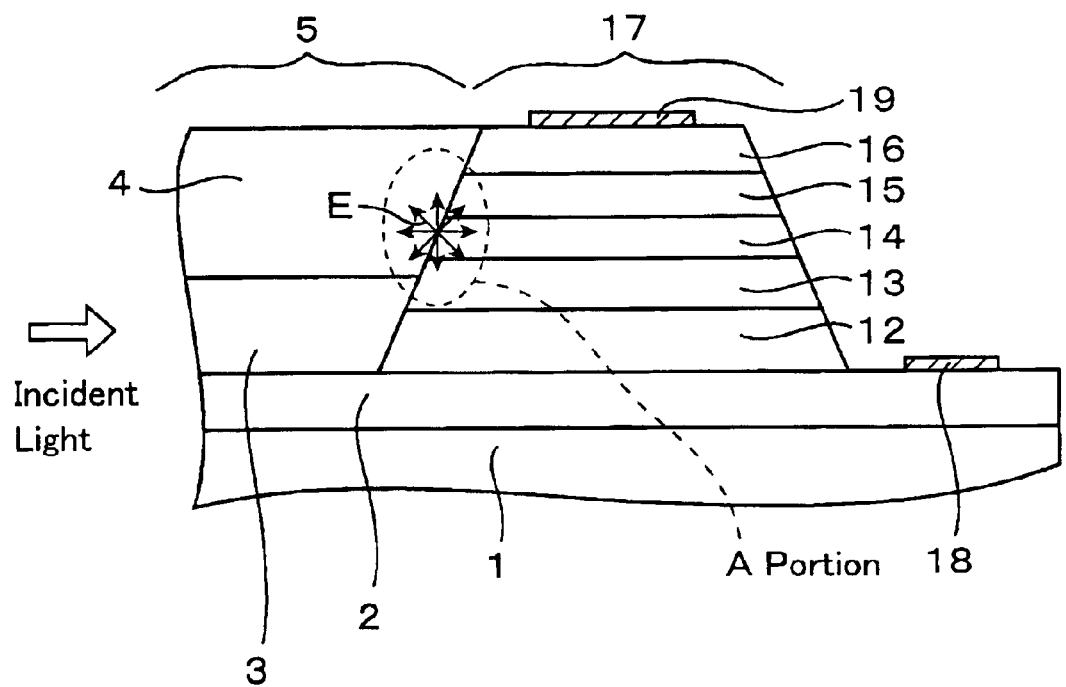
FIG. 2 is a sectional view showing a structure in which a PIN photodiode of the semiconductor photodetector in the prior art is simply replaced with an avalanche photodiode.

If the PIN photodiode 8 shown in FIG. 1 is replaced simply with the avalanche photodiode, the lateral-type incident structure shown in FIG. 2 is derived. In this case, in FIG. 2, the same references as those in FIG. 1 are affixed to the same members as those in FIG. 1.

An avalanche photodiode 17 in FIG. 2 is constructed by forming a photo absorbing layer 12 made of undoped InGaAs, a heterobarrier relaxing layer 13 made of undoped InGaAsP, a field dropping layer (first conductivity type field dropping layer) 14 made of N-type InP, a carrier multiplying layer 15 made of undoped InP, and a P-type InP layer (second conductivity type semiconductor layer) 16 in this order on the N-type semiconductor layer (first conductivity type semiconductor layer) 2.

In this case, a band gap of the heterobarrier relaxing layer 13 is larger than a band gap of the photo absorbing layer 12, and a band gap of the carrier multiplying layer 15 is larger than a band gap of the heterobarrier relaxing layer 13.

In this case, in the present embodiment, as the case may be, silicon may be doped into the InP substrate 1.

Also, an N-side electrode 18 made of Ti/Pt/Au is formed on the N-type semiconductor layer 2, and a P-side electrode 19 made of Ti/Pt/Au is formed on the P-type InP layer 16. A reverse bias voltage is applied between these electrodes.

Out of above layers, the heterobarrier relaxing layer 13 is formed such that compositions of constituent elements are changed gradually from InGaAs to InP, and functions to relax the heterobarrier between the photo absorbing layer 12 and the field dropping layer 14 and also prevent the holes from being trapped by the heterobarrier.

Also, the field dropping layer 14 functions to cause abruptly a drop of the electric field therein and apply the high electric field to the overlying carrier multiplying layer 15.

The light that propagates through the optical waveguide core layer 3 is incident upon the photo absorbing layer 12, and then produces electron-hole pairs therein. The holes out of these pairs flow into the carrier multiplying layer 15. Since the high electric field is applied to the carrier multiplying layer 15 as described above, the injected holes cause the ionization successively, so that the carrier multiplication is carried out. As a result, the photo current that is larger than the case where the PIN photodiode is employed can be obtained.

However, in this structure, since the electric field is concentrated into the field dropping layer 14 near the boundary to the optical waveguide 5 (A portion in FIG. 2), the breakdown is ready to occur at that portion. Then, it causes a disadvantage such that the dark current is increased, or a disadvantage such that multiplication of the avalanche photodiode 17 cannot be set largely because the high voltage cannot be applied between the N-side electrode 18 and the P-side electrode 19.

Figure 3:
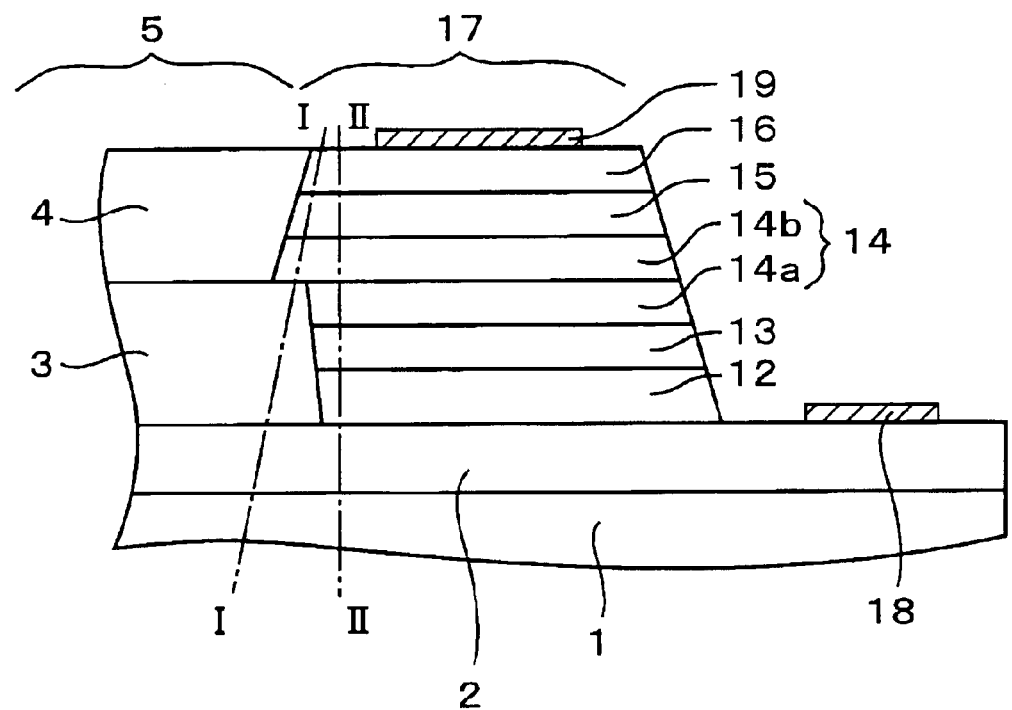
FIG. 3 is a sectional view showing a semiconductor photodetector according to a first embodiment of the present invention.

In view of these respects, the inventors of the present invention thought of a semiconductor photodetector shown in FIG. 3. In FIG. 3, the same references as those in FIG. 2 are affixed to the same members as those in FIG. 2, and their explanation will be omitted herein.

Different respects of this photodetector from the device in FIG. 2 reside in that the field dropping layer 14 consists of an underlying layer 14a and an overlying layer 14b and that the optical waveguide core layer 3 comes into an area that is located below the overlying layer 14b. Since the underlying layer 14a has the composition that is changed gradually from composition of the heterobarrier relaxing layer 13 to composition of the overlying layer 14b upwardly from its lower surface to its upper surface, such underlying layer 14a also functions as the heterobarrier relaxing layer. That results in preventing reduction in a response speed caused because the holes are trapped by the underlying layer 14a. Such underlying layer 14a is formed of N-type InGaAsP, for example, while such overlying layer 14b is formed of InP, for example.

Figure 15:
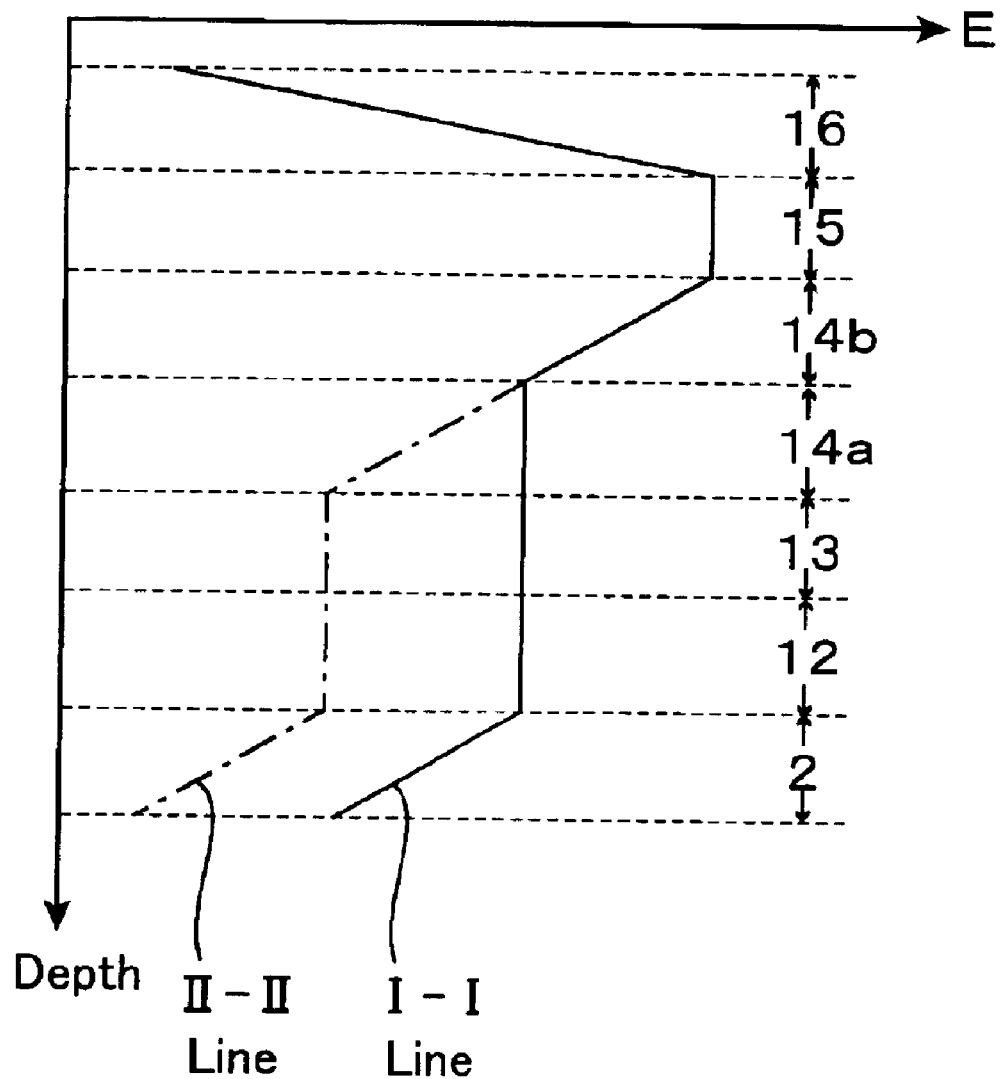
FIG. 15 is a graph showing an electric field distribution in the depth direction of the semiconductor photodetector according to the first embodiment of the present invention.

FIG. 15 is a graph showing an electric field distribution in the depth direction of such semiconductor photodetector, wherein an ordinate denotes a depth from the avalanche photodiode 17 and an abscissa denotes an electric field strength E at that depth. Then, a solid line shows the electric field distribution along a I—I line in FIG. 3, and a dot-dash line shows the electric field distribution along a II—II line in FIG. 3.

As shown in FIG. 15, in the case of the distribution taken along a II—II line, the electric field is dropped by two layers of the underlying layer 14a and the overlying layer 14b. In contrast, in the case of the distribution taken along a I—I line, because the underlying layer 14a is not provided, the electric field is dropped merely by one layer of the overlying layer 14b. As a result, with regard to an area in the graph which is derived by integrating the electric field E with respect to the depth, the area in the case taken along a I—I line becomes larger than that in the case taken along a II—II line.

Normally, it is known that the breakdown voltage of the avalanche photodiode becomes higher as the above area becomes larger. Therefore, in this case, the breakdown voltage in the case taken along a I—I line becomes higher than the breakdown voltage in the case taken along a II—II line.

Accordingly, the breakdown is hard to occur near the boundary to the optical waveguide 5. Therefore, the sufficiently high voltage can be applied between the electrodes 18, 19, and not only multiplication in the avalanche photodiode 17 can be achieved more largely than that in FIG. 2 but also the dark current can be reduced.

Next, steps of manufacturing the semiconductor photodetector, as described above, will be explained with reference to FIG. 4 to FIG. 13 hereunder.

At first, steps required until a sectional structure shown in FIG. 4A is obtained will be explained hereunder.

First, N-type InP, into which Fe as the N-type impurity is doped at $1 \times 10^{18}$ cm$^{-3}$, is epitaxially grown on an InP substrate (semiconductor substrate) 1, into which silicon is doped, to have a thickness of about 2 μm. This layer is used as an N-type semiconductor layer 2. For example, the MOCVD method is employed in this epitaxial growth. Also, layers manufactured by following steps are formed by the MOCVD method.

Then, an undoped InGaAs layer 12a of about 0.5 μm thickness is epitaxially grown on the N-type semiconductor layer 2. In order to achieve the lattice matching between the undoped InGaAs layer 12a and the underlying N-type semiconductor layer 2 made of InP, a composition ratio of In and Ga is set to In:Ga=0.53:0.47 in the undoped InGaAs layer 12a.

Then, an undoped InGaAs$_x$P$_{1-x}$ layer 13a is epitaxially grown on the undoped InGaAs layer 12a. A composition wavelength of the undoped InGaAs$_x$P$_{1-x}$ layer 13a is 1.25 μm, and a thickness thereof is about 0.18 μm, and an x value thereof becomes small gradually from 1.

In addition, an N-type InGaAs$_y$P$_{1-y}$ layer 14c is epitaxially grown on the InGaAs$_x$P$_{1-x}$ layer 13a to have a thickness of about 0.02 μm. In the N-type InGaAs$_y$P$_{1-y}$ layer 14c, Si is doped up to $1 \times 10^{18}$ cm$^{-3}$ as the N-type impurity and the y value is reduced gradually and becomes 0 finally. A composition wavelength of this InGaAs$_y$P$_{1-y}$ layer 14c is 1.25 μm. In this case, in order to achieve the lattice matching between the InGaAs$_x$P$_{1-x}$ layer 13a and the N-type InGaAs$_y$P$_{1-y}$ layer 14c, x=y is set at the boundary between these layers.

Then, an N-type InP layer 14d, into which Si is doped up to $1 \times 10^{18}$ cm$^{-3}$ as the N-type impurity, is epitaxially grown on the N-type InGaAs$_y$P$_{1-y}$ layer 14c to have a thickness of about 0.02 μm.

Then, an InP layer 15a of about 0.20 μm thickness is epitaxially grown on this N-type InP layer 14d. Then, a P-type InP layer 16a, into which Zn is doped by 1×10$^{18}$ cm$^{-3}$ as the P-type impurity, is epitaxially grown thereon.

Then, photoresist is formed on this P-type InP layer 16a. Then, a resist pattern 20 having an almost rectangular planar shape is formed by exposing/developing this photoresist.

Then, while using this resist pattern 20 as an etching mask and using a mixed solution consisting of sulfuric acid and hydrogen peroxide solution as an etchant, respective layers from the P-type InP layer 16a to the undoped InGaAs layer 12a are etched.

Accordingly, as shown in FIG. 4B, the undoped InGaAs layer 12a serves as the photo absorbing layer 12, and the undoped InGaAs$_x$P$_{1-x}$ layer 13a serves as the heterobarrier relaxing layer 13. Also, the N-type InGaAs$_y$P$_{1-y}$ layer 14c serves as the underlying layer 14a of the field dropping layer 14, and the N-type InP layer 14d serves as the overlying layer 14b of the field dropping layer 14. Then, the InP layer 15a and the P-type InP layer 16a serve as the carrier multiplying layer 15 and the P-type semiconductor layer 16 respectively.

In such etching, etching rates of the underlying layer 14a, the heterobarrier relaxing layer 13, and the photo absorbing layer 12 are higher than the etching rate of the overlying layer 14b. Therefore, respective side surfaces of the underlying layer 14a, the heterobarrier relaxing layer 13, and the photo absorbing layer 12 recede inward rather than side surfaces of the overlying layer 14b. The resist pattern 20 is removed after this etching is completed.

Figure 5:
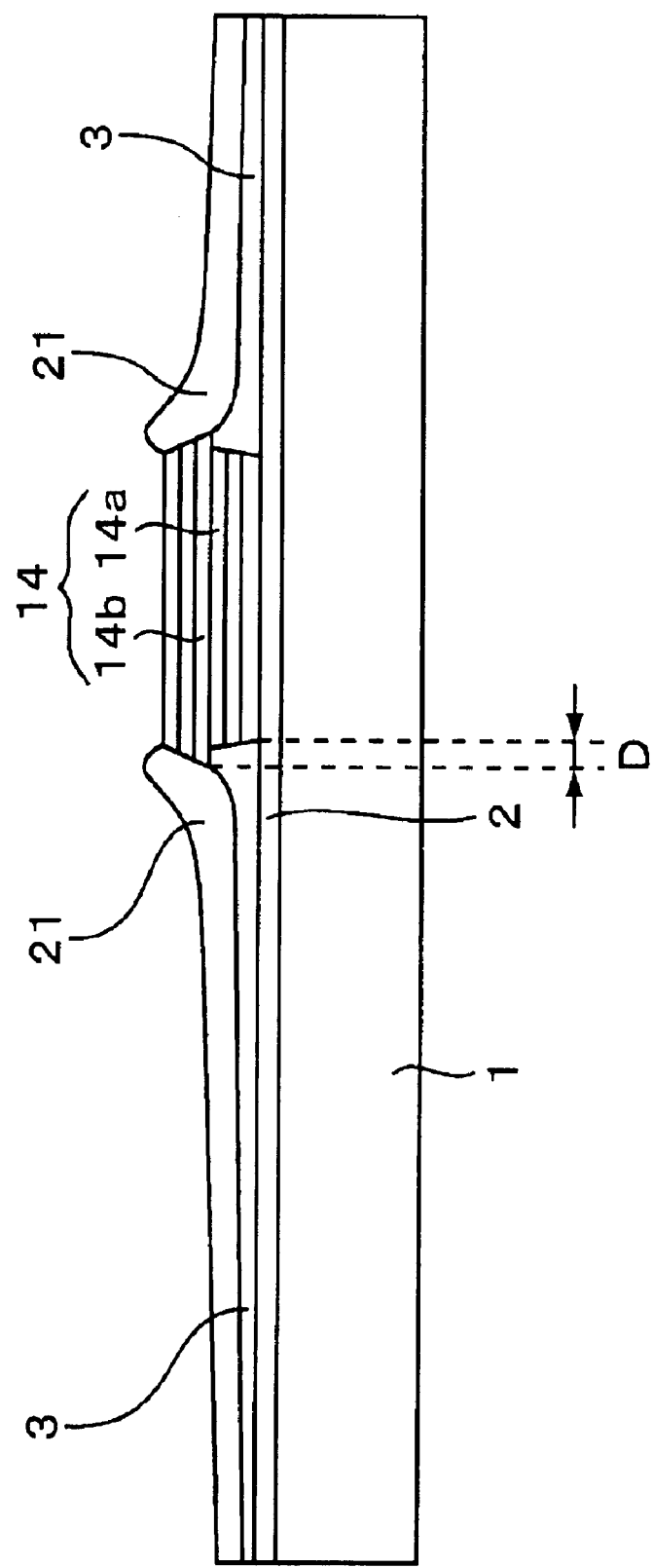
FIG. 5 is a sectional view (#2) showing steps of manufacturing the semiconductor photodetector according to the first embodiment of the present invention.

Next, steps required until a sectional structure shown in FIG. 5 is obtained will be explained hereunder.

First, an undoped InGaAsP layer whose composition wavelength is 1.1 μm is epitaxially grown on the N-type semiconductor layer 2 to have a thickness of about 0.7 μm. This layer is used as the optical waveguide core layer 3. This optical waveguide core layer 3 is constructed to extend under the overlying layer 14b of the field dropping layer 14 by a distance D (=about 0.2 μm).

Then, an undoped InP layer 21 of about 2.0 μm thickness is epitaxially grown on the optical waveguide core layer 3.

Figure 6:
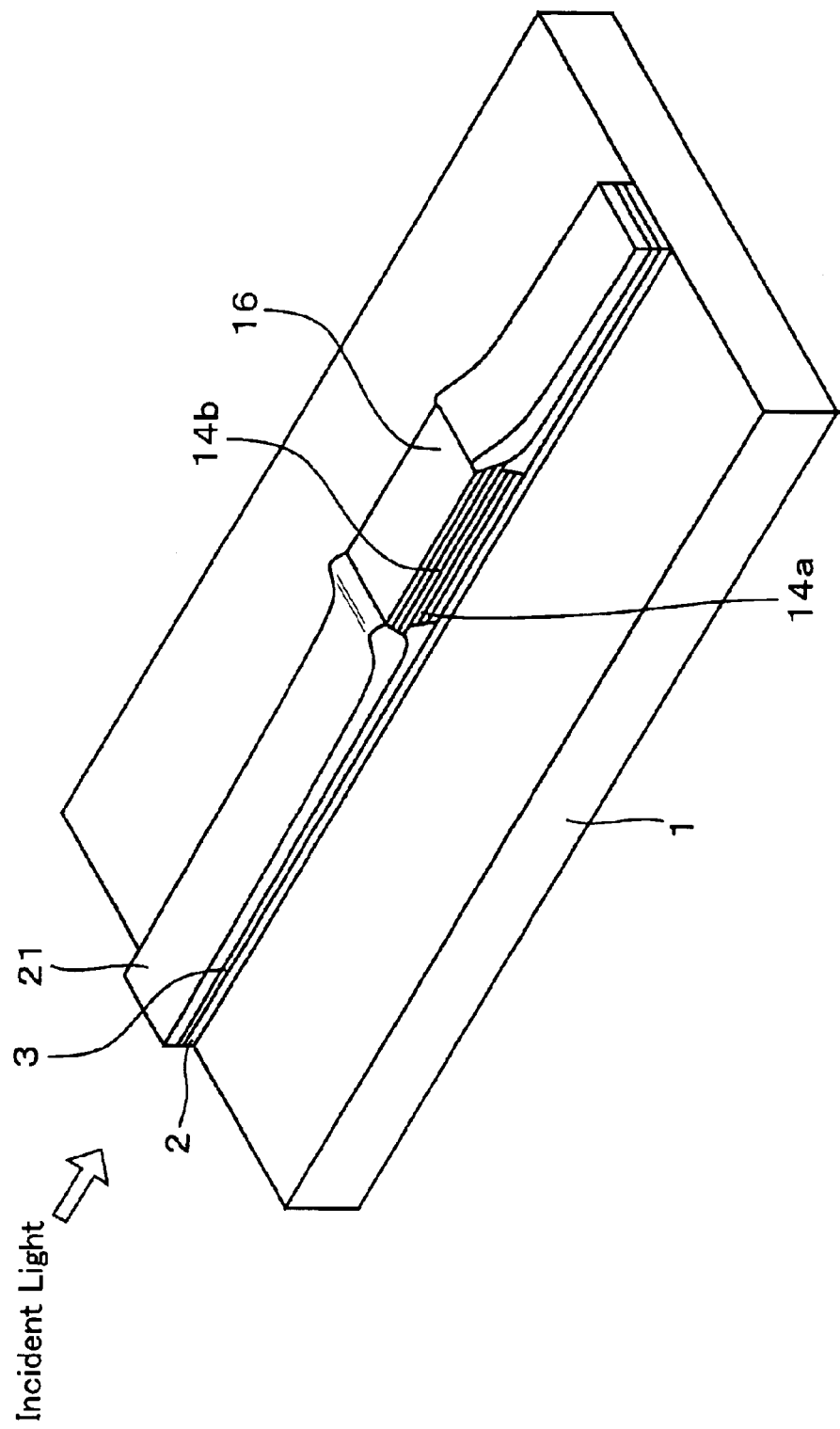
FIG. 6 is a perspective view showing steps of manufacturing the semiconductor photodetector according to the first embodiment of the present invention.

Then, as shown in a perspective view of FIG. 6, respective layers formed on the InP substrate 1 as described above are patterned like a stripe along the light traveling direction.

Figure 7A:
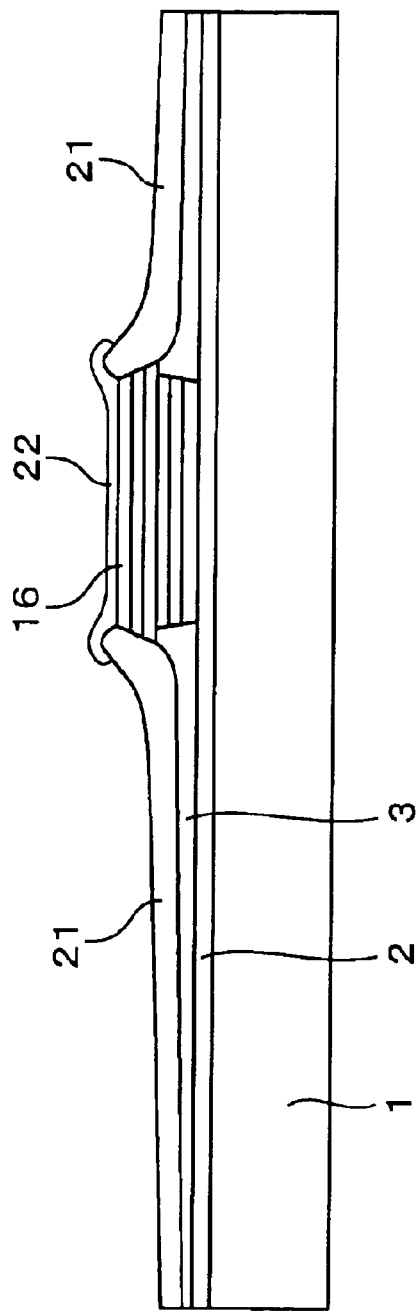
FIG. 7 is a sectional view (#3) showing steps of manufacturing the semiconductor photodetector according to the first embodiment of the present invention.

Then, as shown in FIG. 7A, an SiO$_2$ film 22 for covering edge portions of the undoped InP layer 21 and the P-type semiconductor layer 16 is formed by the thermal CVD method to have a thickness of about 0.1 μm.

Figure 7B:
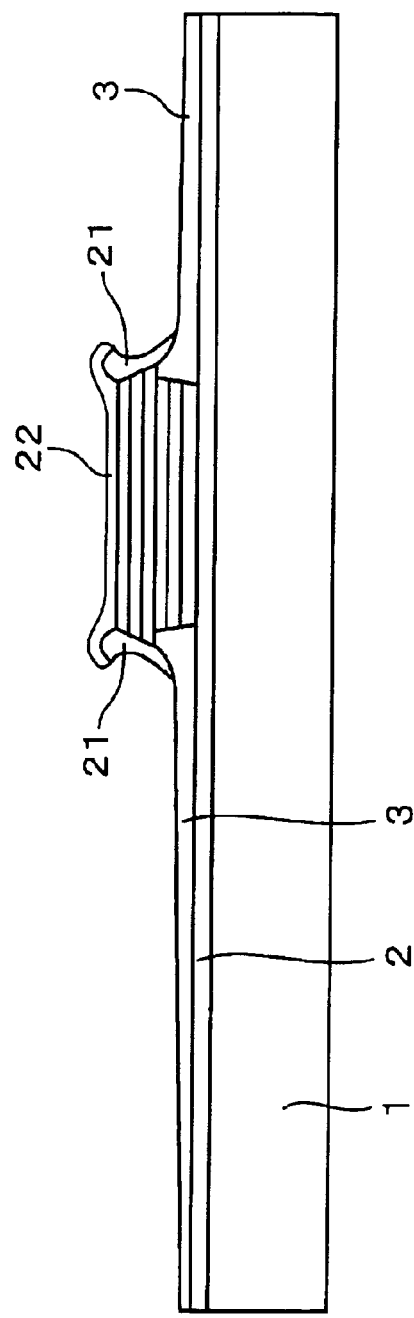

Then, as shown in FIG. 7B, portions of the undoped InP layer 21, which are not covered with the SiO$_2$ film 22, are etched/removed selectively by the wet etching using an HCl solution as an etchant while using the SiO$_2$ film 22 as an etching mask.

Then, as shown in FIG. 8A, an undoped InP layer of about 2 μm thickness is epitaxially grown on side surfaces of the remaining undoped InP layer 21 and on the optical waveguide core layer 3. This layer is used as the upper cladding layer 4.

Then, as shown in FIG. 8B, a surface of the P-type semiconductor layer 16 is exposed by removing the SiO$_2$ film 22. Then, a Ti film of about 3 nm thickness, a Pt film of about 200 nm thickness, and an Au film of about 2 μm thickness are formed thereon in this order by the vapor deposition method. These films constitute the P-side electrode 19. A jointed area between the P-side electrode 19 and the P-type semiconductor layer 16 is set to 6 μm×9 μm.

Then, as shown in FIG. 9A, respective layers from the upper cladding layer 4 to a part of the InP substrate 1, which are formed on the opposite side to the light incident side, are removed by executing the dry etching in the SiF$_4$ atmosphere. Thus, a surface of the N-type semiconductor layer 2 is exposed and also a stepped surface 1a is formed on the InP substrate 1.

Then, as shown in FIG. 9B, an AuGe film and an Au film are laminated in this order on the stepped surface 1a and surface of the N-type semiconductor layer 2 by the vapor deposition method. These films constitute the N-side electrode 18.

Figure 10:
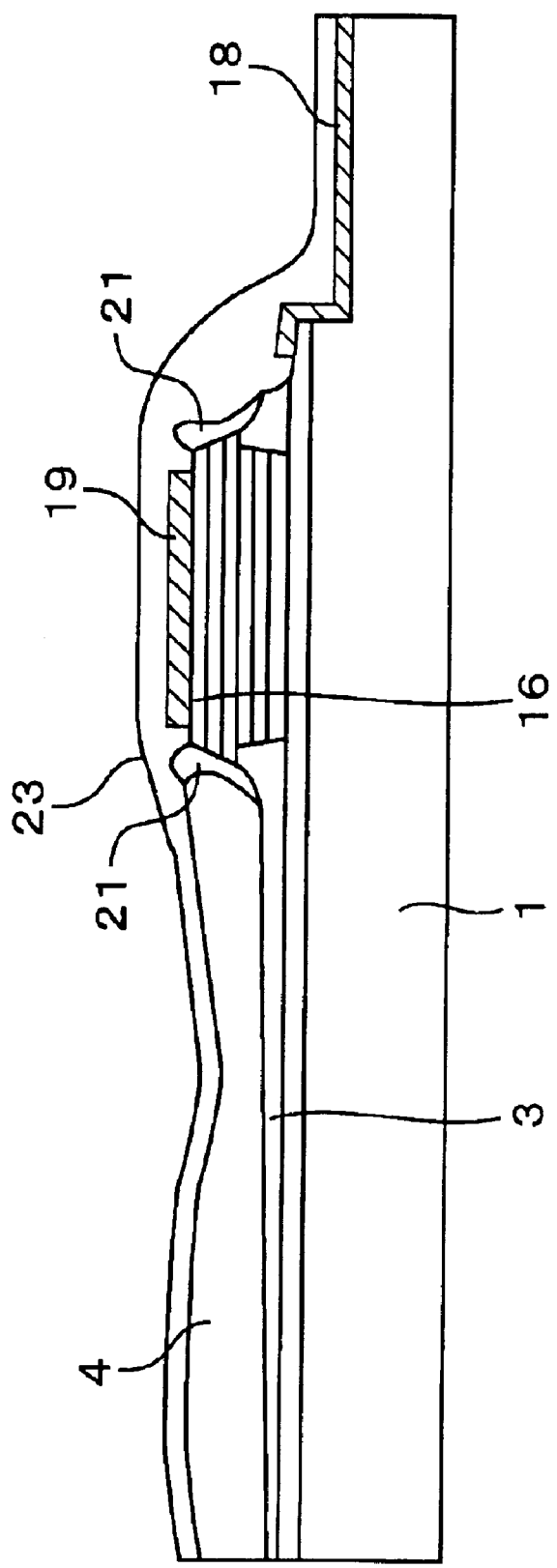
FIG. 10 is a sectional view (#6) showing steps of manufacturing the semiconductor photodetector according to the first embodiment of the present invention.

Then, as shown in FIG. 10, an SiN film 23 of about 0.3 μm thickness is formed on an overall surface by the CVD method.

Figure 11:
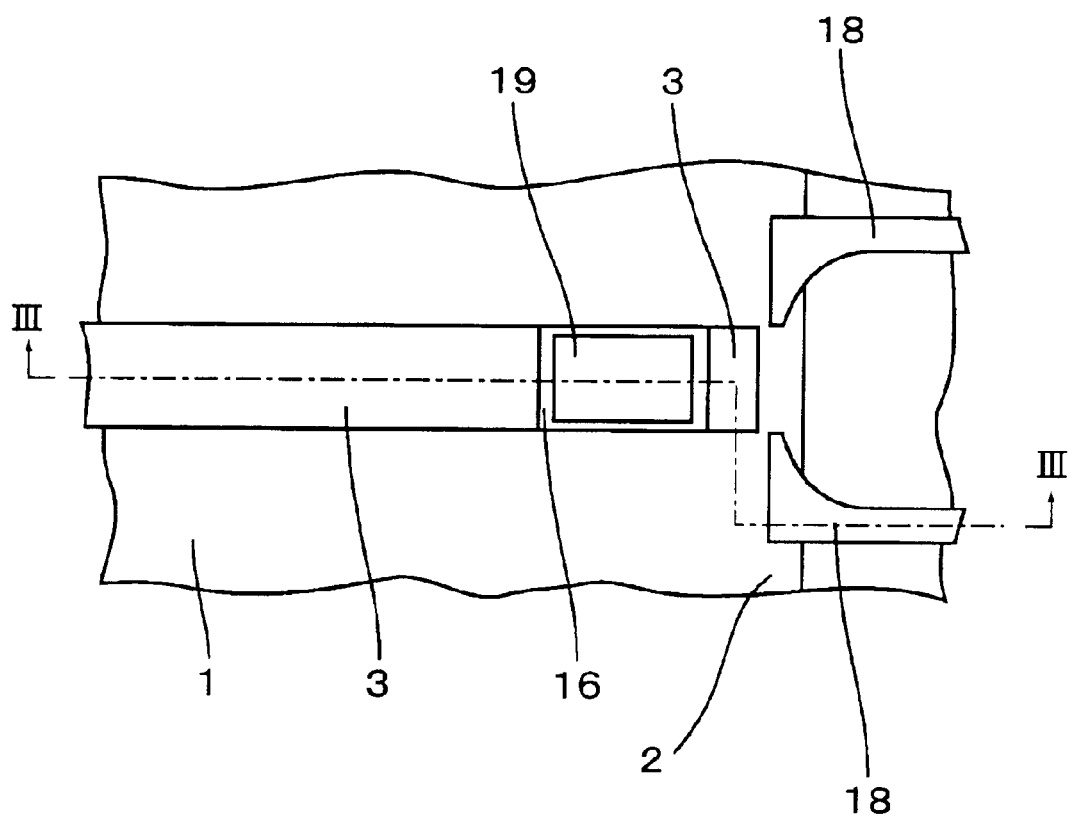
FIG. 11 is a plan view (#1) showing steps of manufacturing the semiconductor photodetector according to the first embodiment of the present invention.

In this case, a plan view obtained by the steps executed up to now is shown in FIG. 11. In FIG. 11, the SiN film 23, the upper cladding layer 4, and the InP layer 21 are omitted. Here, above FIG. 10 corresponds to a sectional view taken along a III—III line in FIG. 11.

As shown in FIG. 11, two N-side electrodes 18 are formed and have a hook-like planar shape respectively.

Figure 12:
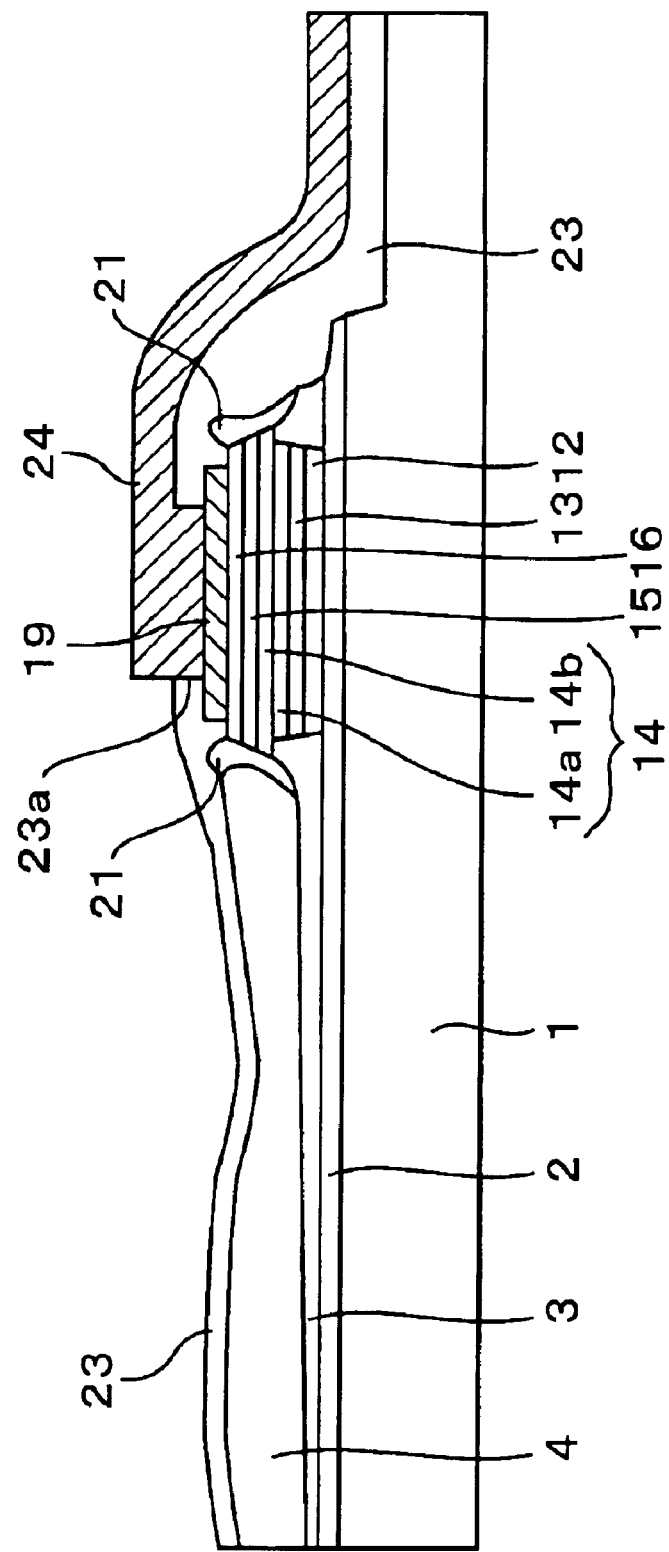
FIG. 12 is a sectional view (#7) showing steps of manufacturing the semiconductor photodetector according to the first embodiment of the present invention.

Then, as shown in FIG. 12, a hole 23a is formed in the SiN film 23 on the P-side electrode 19. Then, a Ti/Au film is formed in the hole 23a and on a portion of the SiN film 23, which extends from the hole 23a to an area over the stepped surface 1a. This film is used as a P-side electrode leading wiring 24.

Figure 13:
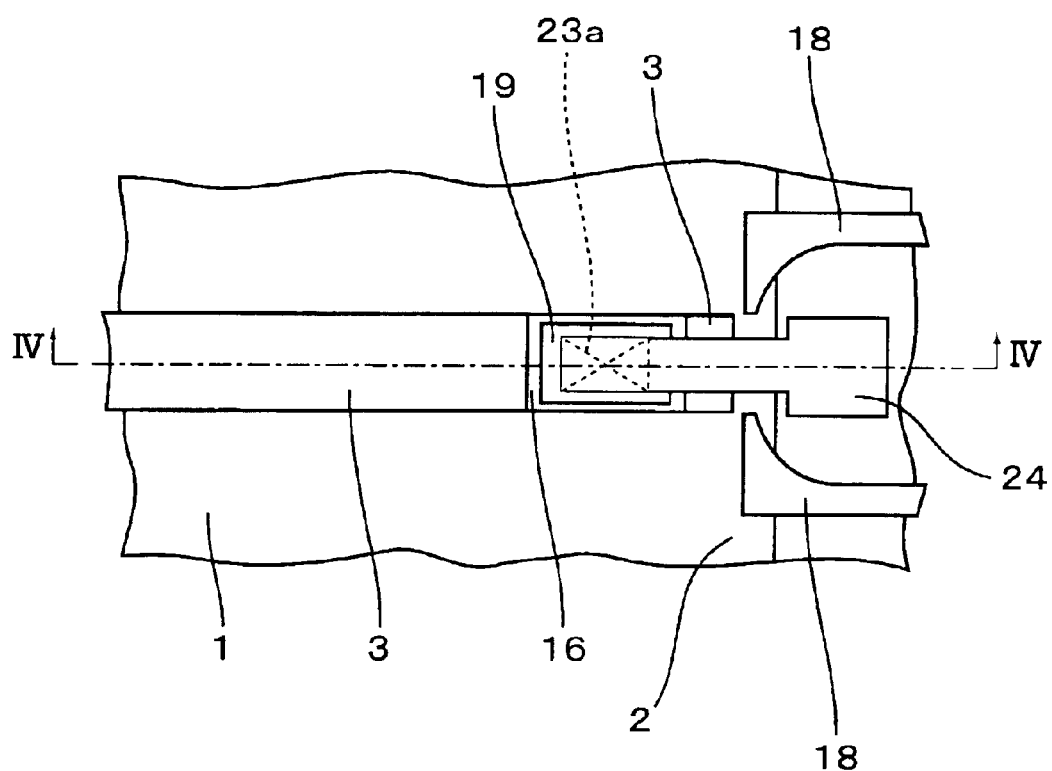
FIG. 13 is a plan view (#2) showing steps of manufacturing the semiconductor photodetector according to the first embodiment of the present invention.

A plan view of the structure obtained by the steps executed up to now is shown in FIG. 13. In FIG. 13, the SiN film 23, the upper cladding layer 4, and the InP layer 21 are omitted. Here, above FIG. 12 corresponds to a sectional view taken along a IV—IV line in FIG. 13.

Figure 14:
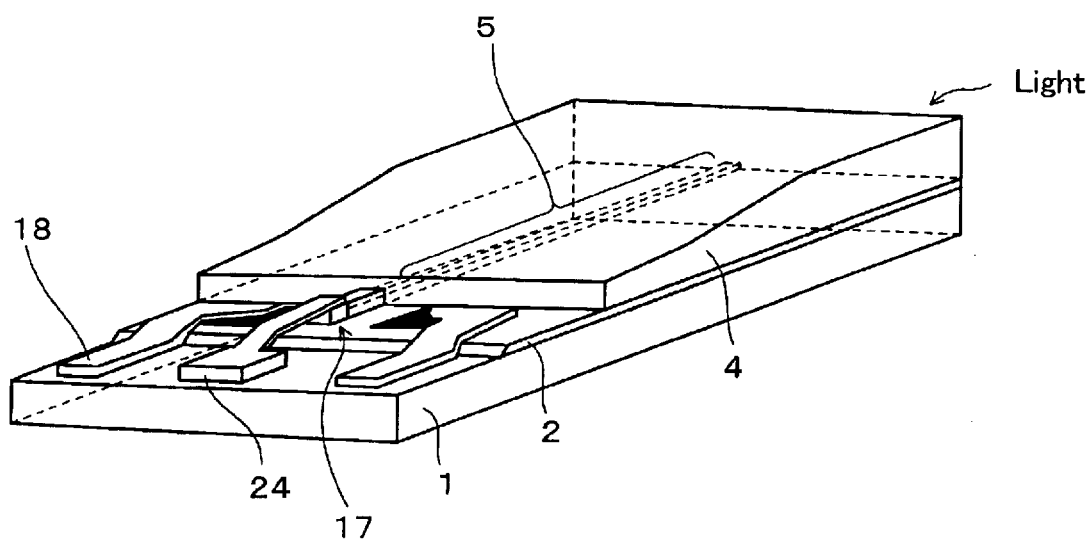
FIG. 14 is a perspective view showing the semiconductor photodetector according to the first embodiment of the present invention.

With the above, the semiconductor photodetector according to the present embodiment is completed. A perspective view of this semiconductor photodetector is given as shown in FIG. 14. When a voltage of almost 30 V is applied between the P-side electrode leading wiring 24 and the N-side electrode, a sufficient multiplication factor that is in excess of 10 times can be obtained.

(Second Embodiment)

In the above-mentioned first embodiment, the semiconductor photodetector incorporating the avalanche photodiode 17 into the lateral-type incident structure can have the receiving sensitivity that is higher than that obtained by using the PIN photodiode.

Meanwhile, in the semiconductor photodetector used in the trunk network of the optical communication, it is preferable that not only it has the high receiving sensitivity in this manner, but also it should be operated at a high speed so that it can receive the light signal modulated at a high transmission rate such as about 40 Gbit/sec and then it can generate the photo current which follows up such light signal.

In the present embodiment, an explanation will be performed with respect to an avalanche photodiode that is capable of receiving the light signal being modulated at a high speed in this manner.

First of all, an explanation will be performed hereunder with respect to basic matters about the high speed characteristic of the avalanche photodiode.

The high speed characteristic of the avalanche photodiode is disclosed in Non-Patent Literature 1, for example. A 3-dB cut-off frequency $f_{3dB}$ of the avalanche photodiode in a multiplication rise time is represented therein by a following Equation.

$$f_{3dB}=1/(2\pi M)\times N(k)k\times v/w \quad (1)$$

In Equation (1), M is a multiplication factor, k is a ratio of ionization rates of the electron and the hole in the carrier multiplying layer, v is a saturation velocity of the carrier in the carrier multiplying layer, w is a film thickness of the carrier multiplying layer, and N(k) is a dimensionless function that changes slowly with respect to k and is normally approximated to a constant value.

As shown in Equation (1), since the 3-dB cut-off frequency $f_{3dB}$ is in inverse proportion to the multiplication factor M, a product of the 3-dB cut-off frequency $f_{3dB}$ and the multiplication factor M becomes constant. This product is called a multiplication-bandwidth product (MB product). The avalanche photodiode can be operated at a higher speed as this product value becomes larger.

The 40 Gbit/sec trunk network needs an avalanche photodiode of a bandwidth of 28 GHz that corresponds to 70% of a bit rate and the MB product of 200 GHz such that it operates at the optimum multiplication factor of 7 times. However, the avalanche photodiode having such large MB product has not been provided to the market yet.

It is understood from Equation (1) that there are two approaches as the approach of increasing the MB product.

The first approach is the approach of increasing the ratio k of ionization rates. Since the ratio k of ionization rates is decided according to the material, the material must be changed to change the value. In the first embodiment, the carrier multiplying layer 15 is formed of InP. But there is AlInAs as the material that has the larger ratio k of ionization rates than InP. However, since AlInAs has the high deliquescence property and absorbs a moisture to cause the deterioration of its characteristic, such AlInAs causes reduction in the reliability of the photodetector.

The second approach is the approach of reducing the film thickness of the carrier multiplying layer 15. If this approach is employed, the voltage that is larger than that in the first embodiment must be applied to the carrier multiplying layer 15 in order to produce a large number of electron-hole pairs in the thin carrier multiplying layer 15.

Figure 16:
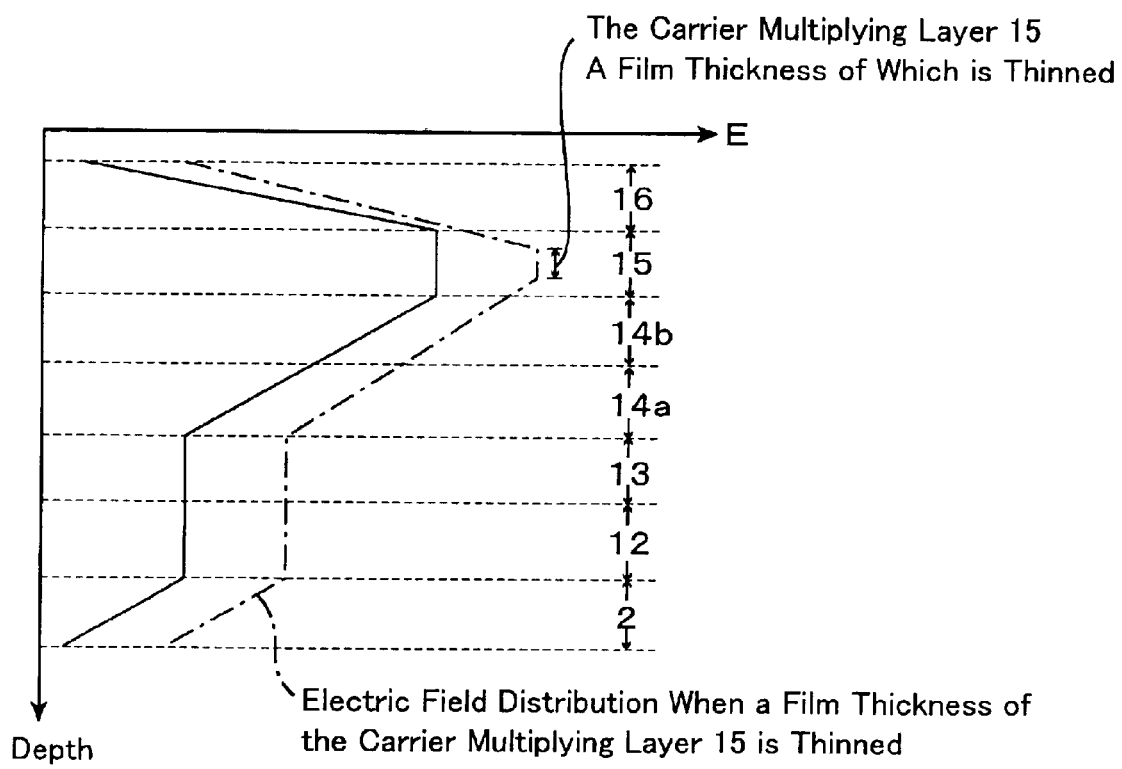
FIG. 16 is a view showing the electric field distribution in both cases where a carrier multiplying layer in the semiconductor photodetector according to the first embodiment of the present invention is thinned and is not thinned.

FIG. 16 is a graph showing the electric field distribution in the depth direction of the semiconductor photodetector shown in FIG. 3, wherein an ordinate denotes a depth from the avalanche photodiode 17 and an abscissa denotes an electric field distribution E at that depth. Then, a solid line indicates the electric field distribution along a II—II line in FIG. 3 in the first embodiment in which the carrier multiplying layer 15 is not thinned, and a dot-dash line indicates the electric field distribution along a II—II line when the carrier multiplying layer 15 is thinned.

As apparent from FIG. 16, if it is intended to apply the large voltage to the thin carrier multiplying layer 15 as described above, the large voltage is also applied to the underlying photo absorbing layer 12.

However, since a band gap of the photo absorbing layer 12 is narrow, even if applied voltage to the photo absorbing layer 12 is smaller than applied voltage to the carrier multiplying layer 15, the avalanche multiplication is caused in the photo absorbing layer 12. As a result, the effective multiplication area width is spread up to the photo absorbing layer 12 although the carrier multiplying layer 15 is thinned. Thus, the w in equation (1) is increased and rather the MB product is lowered.

Hence, even though the above two approaches are employed, it is impossible to attain the high MB product although the highly-reliable InP is employed as the carrier multiplying layer 15.

In view of these respects, in order to attain the high MB product by the different approach from the above, the inventors of this application carried out various experiments as follows.

Figure 17:
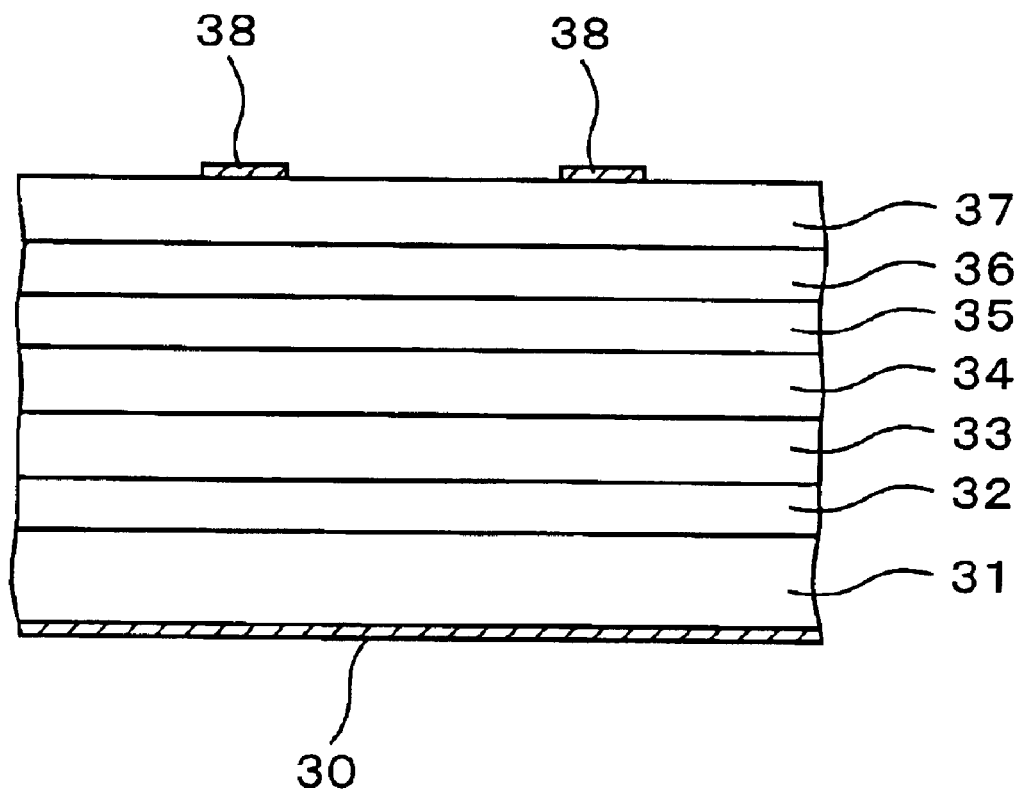
FIG. 17 is a sectional view showing an avalanche photodiode according to a second embodiment of the present invention.

FIG. 17 is a sectional view showing a planar avalanche photodiode according to the present embodiment, which is manufactured for this experiment.

In this avalanche photodiode, an N-type semiconductor layer 32 is epitaxially grown on an N-type InP substrate 31 to have a thickness of 2 $\mu$m. The N-type semiconductor layer 32 is made of InP into which Si is doped as the N-type impurity at a concentration of $1\times10^{18}$ cm$^{-3}$. Then, a photo absorbing layer 33 made of undoped InGaAs is epitaxially grown on the N-type semiconductor layer 32 to have a thickness of 0.2 $\mu$m. In order to achieve the lattice matching between the photo absorbing layer 33 and the underlying N-type semiconductor layer 32, a composition ratio of In and Ga is set to In:Ga=0.53:0.47 in InGaAs constituting the photo absorbing layer 33.

In addition, an undoped InGaAs$_x$P$_{1-x}$ layer is epitaxially grown as a heterobarrier relaxing layer 34 on the photo absorbing layer 33. A composition wavelength of the undoped InGaAs$_x$P$_{1-x}$ layer is 1.25 $\mu$m, and a thickness thereof is about 0.1 $\mu$m, and an x value thereof is reduced gradually from 1.

Then, an N-type InP is epitaxially grown as an N-type field dropping layer 35 on the heterobarrier relaxing layer 34 to have a thickness of 0.02 $\mu$m. In the N-type InP, Si is doped at a concentration of $1\times10^{18}$ cm$^{-3}$ as the N-type impurity.

A carrier multiplying layer 36 made of undoped InP and is epitaxially grown on the N-type field dropping layer 35 to have a thickness of 0.05 $\mu$m. Then, a P-type semiconductor layer 37 is epitaxially grown thereon. The P-type semiconductor layer 37 is made of P-type InP into which Zn is doped at a concentration of $1\times10^{18}$ cm$^{-3}$ as the P-type impurity.

Then, a Ti/Pt/Au layer is formed on this P-type semiconductor layer 37 by laminating an Au (gold) layer of 2 $\mu$m thickness, a Pt (platinum) layer of 0.2 $\mu$m thickness, and a Ti (titanium) layer of 0.03 $\mu$m thickness in this order. Then, a P-side electrode 38 is formed on this P-type semiconductor layer 37 by patterning the Ti/Pt/Au layer into a ring-like planar shape.

Also, an AuGe/Au layer is formed as an N-side electrode 30 on one major surface of two major surfaces of the InP substrate 31 located on the opposite side to the side where the P-side electrode 38 is formed. The AuGe/Au layer is formed by laminating an Au layer of 0.27 $\mu$m thickness and an AuGe layer of 0.03 $\mu$m thickness in this order.

Since functions of above respective layers 33 to 37 are equal to those of respective layers 12 to 16 explained in the first embodiment respectively, their explanation will be omitted herein.

Figure 18:
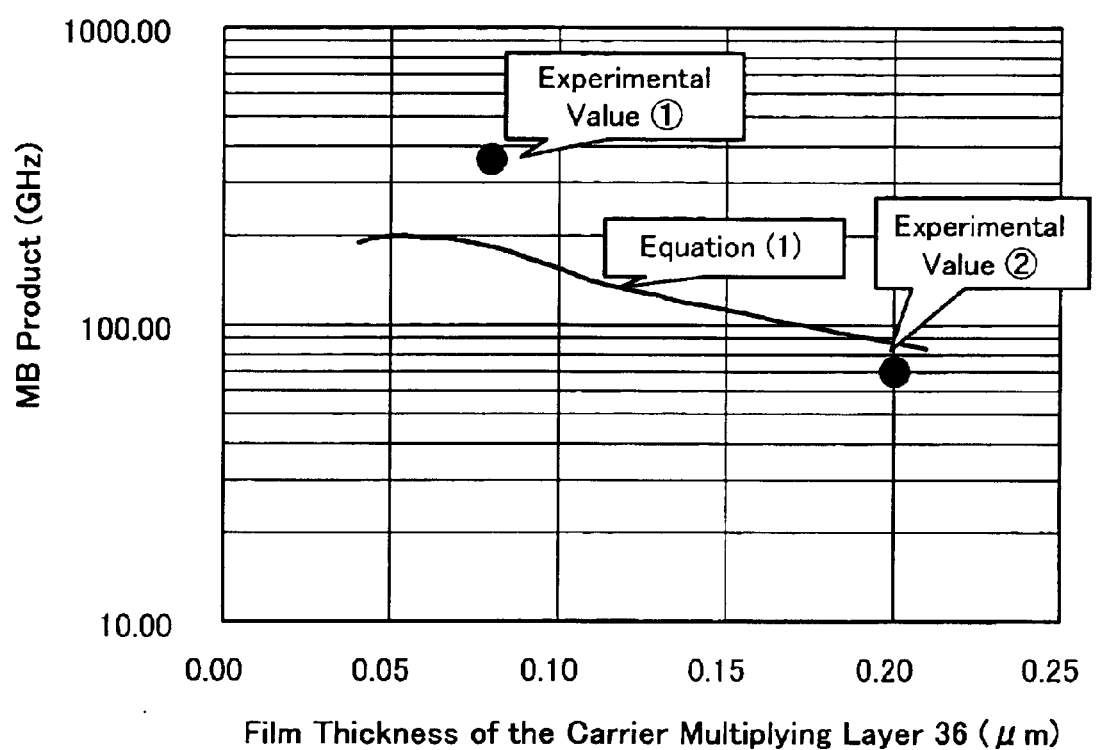
FIG. 18 is a graph showing a relationship between a film thickness of the carrier multiplying layer and an MB product, in the avalanche photodiode according to the second embodiment of the present invention.

FIG. 18 is a graph showing experimentally how the MB product of the avalanche photodiode is changed when a film thickness of the carrier multiplying layer 36 made of InP is varied. In this experiment, a thickness of the photo absorbing layer 33 is also varied so that the thickness of the photo absorbing layer 33 is set to 0.2 $\mu$m in an experimental value ① in FIG. 18 and the thickness of the photo absorbing layer 33 is set to 0.8 $\mu$m in an experimental value ②. Also, for comparison, the MB product values that are predicted based on Equation (1) are also depicted in FIG. 18.

As shown in FIG. 18, resultant experimental values become smaller than a theoretical value calculated by Equation (1) in an area where the film thickness of the carrier multiplying layer 36 is thick. In contrast, when the film thickness of the carrier multiplying layer 36 becomes thinner than 0.1 μm, the MB product value of 200 GHz that is necessary for the 40 Gbit/sec trunk communication can be obtained and this value becomes larger than the theoretical value.

In this manner, if the film thickness of the carrier multiplying layer 36 is reduced, the large MB value can be obtained. However, if the film thickness of the carrier multiplying layer 36 is excessively reduced, the high voltage must be applied to the carrier multiplying layer 36 to cause the electron-hole pair production effectively. As a result, it is possible that a tunnel current which flows through the carrier multiplying layer 36 is increased.

The inventors of this application carried out the experiment to check how a value of the tunnel current flowing through the carrier multiplying layer 36 is changed correspondingly by varing the film thickness of the carrier multiplying layer 36. The result is shown in FIG. 19.

Figure 19:
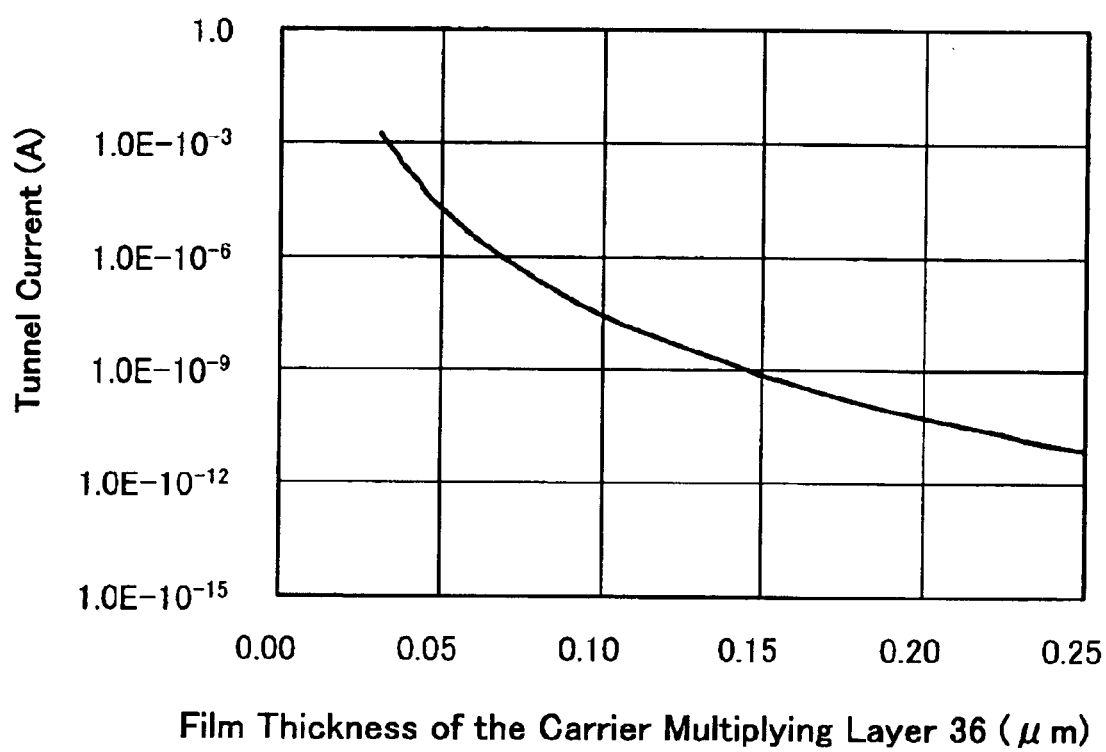
FIG. 19 is a graph showing a relationship between the film thickness of the carrier multiplying layer and a tunnel current, in the avalanche photodiode according to the second embodiment of the present invention.

As shown in FIG. 19, there is a tendency such that the tunnel current is increased more largely as the film thickness of the film thickness of the carrier multiplying layer 36 is reduced smaller.

Practically the tunnel current must be suppressed smaller than 1 μA. It is understood from FIG. 19 that, in order to satisfy this value, a lower limit of the film thickness of the carrier multiplying layer 36 should be set to 0.07 μm.

Figure 20:
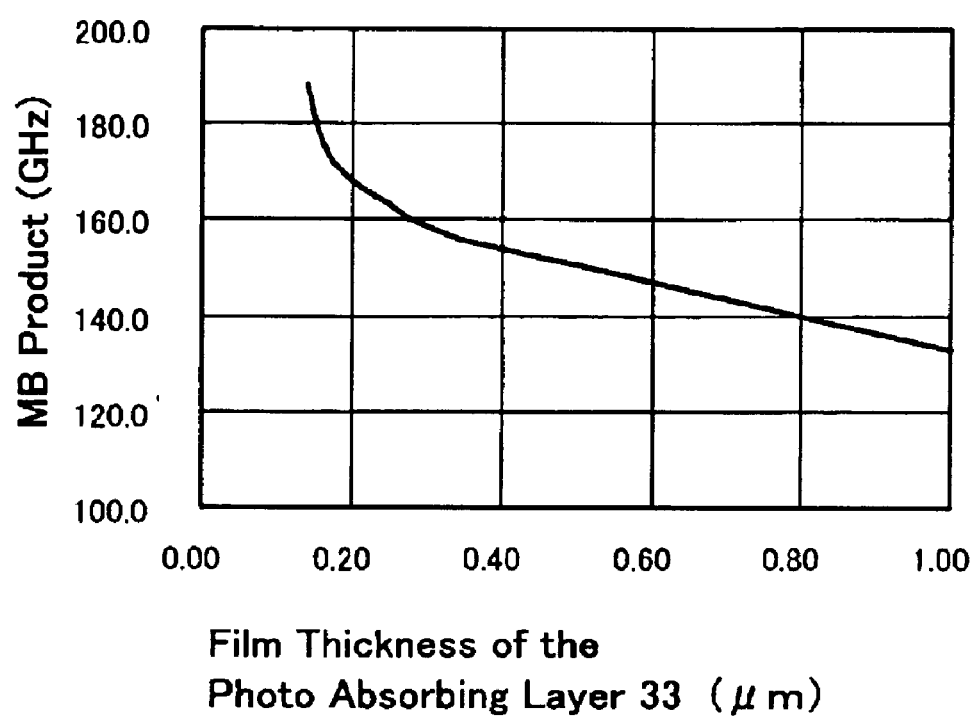
FIG. 20 is a graph showing a film thickness of a photo absorbing layer and the MB product, in the avalanche photodiode according to the second embodiment of the present invention.

Meanwhile, FIG. 20 is a graph showing experimentally how the MB product is changed when the film thickness of the photo absorbing layer 33 is varied. In this experiment, the film thickness of the carrier multiplying layer 36 is fixed to 0.1 μm.

As shown in FIG. 20, there is a tendency such that the MB product is increased as the film thickness of the photo absorbing layer 33 is reduced. Such increasing tendency becomes particularly conspicuous when the film thickness of the photo absorbing layer 33 is thinned smaller than 0.2 μm. Accordingly, it is appreciated that, in order to attain the large MB product, the film thickness of the photo absorbing layer 33 should be thinned smaller than 0.2 μm.

By the way, if the film thickness of the photo absorbing layer 33 is excessively reduced to increase the MB product, it is possible that a quantum efficiency of the electron-hole pair production in the photo absorbing layer 33 is lowered.

The inventors of this application carried out the experiment to check how the quantum efficiency in the photo absorbing layer 33 is changed when the film thickness of the photo absorbing layer 33 is varied. The result is shown in FIG. 21.

Figure 21:
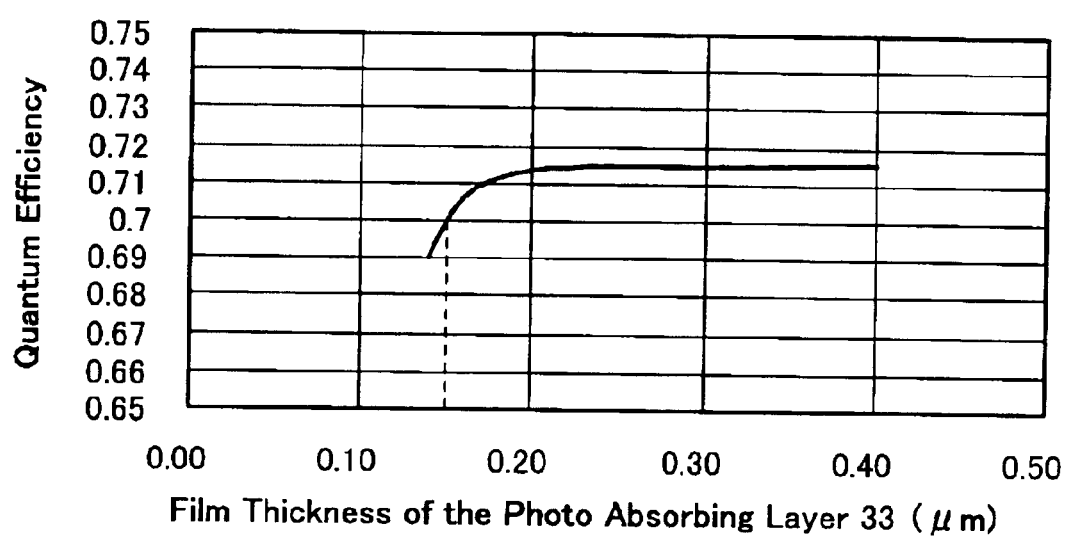
FIG. 21 is a graph showing a relationship between the film thickness of the photo absorbing layer and a quantum efficiency, in the avalanche photodiode according to the second embodiment of the present invention.

As shown in FIG. 21, the quantum efficiency tends to become lower as the film thickness of the photo absorbing layer 33 is reduced smaller. Practically the quantum efficiency that is in excess of 0.7 is needed. It is understood from FIG. 21 that, in order to satisfy this value, the film thickness of the photo absorbing layer 33 should be set to 0.15 μm or more.

According to the above experimental results in FIG. 18 to FIG. 21, it is apparent that, if the film thickness of the carrier multiplying layer 36 is set to more than 0.07 μm but less than 0.1 μm and the film thickness of the photo absorbing layer 33 is set to more than 0.15 μm but less than 0.2 μm, the large MB product that is not predicted from Equation (1) can be derived.

The inventors of this application considered the reason why such advantage can be achieved, as follows. First, in InP, the dead space of the hole is longer than the dead space of the electron and is almost 0.01 μm. Therefore, it may be considered that, if the film thickness of the carrier multiplying layer 36 made of InP is reduced almost several times the dead space of the hole, the scattering number of times of the hole in the carrier multiplying layer 36 becomes smaller than that of the electron, and thus it is considered that the ionization rate of the hole becomes larger than the ionization rate of the electron. As a result, it is supposed that k in Equation (1) is increased and the MB product is increased.

Also, if one carrier is particularly observed, the carrier drifts more quickly than its saturation velocity in an interval from the scattering of the carrier at a time point to the subsequent scattering. Therefore, it is supposed that, if the scattering number of times of the hole is reduced as described above, the saturation velocity v of the hole is increased. As a result, it is considered that the MB product is increased according to Equation (1).

According to the avalanche photodiode having such large MB product, the photo current which follows up the light signal being modulated at a high speed such as about 40 Gbit/sec can be extracted, and thus it can contribute largely to the implementation of the trunk network in the next generation optical communication.

In the above, the explanation is performed with regard to the planar avalanche photodiode shown in FIG. 17. But the present embodiment is not limited to this, and the present embodiment is also applied to the avalanche photodiode 17 in the lateral-type incident structure explained in the first embodiment in FIG. 3. In such case, if the film thickness of the carrier multiplying layer 15 is set to more than 0.07 μm but less than 0.1 μm and the film thickness of the photo absorbing layer 12 is set to more than 0.15 μm but less than 0.2 μm, there can be obtained the semiconductor photodetector having the lateral-type incident structure, in which the avalanche photodiode 17 is coupled to the optical waveguide 5 and it can be operated at a high speed such as about 40 Gbit/sec.

As described above, according to the semiconductor photodetector of the present invention, the avalanche photodiode is formed in place of the PIN photodiode in the prior art. It leads to extracting the larger photo current than the prior art and increasing the receiving sensitivity.

Also, in such semiconductor photodetector, the side surface of the underlying layer of the first conductivity type field dropping layer comes into contact with the side surface of the optical waveguide core layer, and a part of the overlying layer of the first conductivity type field dropping layer is formed on the optical waveguide core layer. Therefore, the breakdown voltage at the edge portion of the avalanche photodiode can be enhanced, and thus the breakdown is difficult to occur.

In addition, the composition of the underlying layer of the first conductivity type field dropping layer is changed from its lower surface to its upper surface to function as the heterobarrier relaxing layer. Therefore, it can be prevented that the carrier is trapped by the underlying layer to lower the response speed of the semiconductor photodetector.

Further, according to the avalanche photodiode of the present invention, the film thickness of the photo absorbing layer is set to more than 0.15 μm but less than 0.2 μm and the film thickness of the carrier multiplying layer is set to more than 0.07 μm but less than 0.1 μm. Therefore, the value of the MB product can be increased more largely than the value that is predicted theoretically, and also the operating speed of the avalanche photodiode can be accelerated.

What is claimed is:

1. A semiconductor photodetector comprising:
   (i) a semiconductor substrate;
   (ii) an optical waveguide having
      (a) a first conductivity type semiconductor layer formed on the semiconductor substrate,
      (b) an optical waveguide core layer formed on a partial area of the first conductivity type semiconductor layer, and
      (c) an upper cladding layer formed on the optical waveguide core layer; and
   (iii) an avalanche photodiode coupled to the optical waveguide, constructed by forming in sequence on another area of the first conductivity type semiconductor layer
      (a) a photo absorbing layer,
      (b) a heterobarrier relaxing layer, an underlying layer of a first conductivity type field dropping layer,
      (c) an overlying layer of the first conductivity type field dropping layer,
      (d) a carrier multiplying layer, and
      (e) a second conductivity type semiconductor layer;
   wherein a side surface of the underlying layer of the first conductivity type field dropping layer comes into contact with a side surface of the optical waveguide core layer, and a part of the overlying layer of the first conductivity type field dropping layer is formed on the optical waveguide core layer.

2. A semiconductor photodetector according to claim 1, wherein a film thickness of the carrier multiplying layer is set to more than 0.07 $\mu$m but less than 0.1 $\mu$m, and a film thickness of the photo absorbing layer is set to more than 0.15 $\mu$m but less than 0.2 $\mu$m.

3. A semiconductor photodetector according to claim 1, wherein composition of the underlying layer of the first conductivity type field dropping layer is changed from a lower surface to an upper surface to function as the heterobarrier relaxing layer.

4. A semiconductor photodetector according to claim 1, wherein a band gap of the heterobarrier relaxing layer is larger than a band gap of the photo absorbing layer, and a band gap of the carrier multiplying layer is larger than a band gap of the heterobarrier relaxing layer.

5. A semiconductor photodetector according to claim 1, wherein the underlying layer of the first conductivity type field dropping layer is formed of N-type InGaAs, and the overlying layer of the first conductivity type field dropping layer is formed of N-type InP.

6. A semiconductor photodetector according to claim 1, wherein the semiconductor substrate is an InP substrate, the first conductivity type semiconductor layer is an N-type InP layer, the photo absorbing layer is an undoped InGaAs layer, the heterobarrier relaxing layer is an undoped InGaAsP layer, the carrier multiplying layer is an undoped InP layer, the optical waveguide core layer is an undoped InGaAsP layer, and the upper cladding layer is an InP layer.

7. An avalanche photodiode comprising:
   (i) a semiconductor substrate;
   (ii) a photo absorbing layer formed over the semiconductor substrate and having a film thickness of more than 0.15 $\mu$m but less than 0.2 $\mu$m;
   (iii) a carrier multiplying layer formed over the photo absorbing layer and having a film thickness of more than 0.07 $\mu$m but less than 0.1 $\mu$m
   (iv) a heterobarrier relaxing layer formed on the photo absorbing layer; and
   (v) a field dropping layer formed on the heterobarrier relaxing layer;
   wherein the carrier multiplying layer is formed on the field dropping layer.

8. An avalanche photodiode according to claim 7, wherein the photo absorbing layer is an undoped InGaAs layer, and the carrier multiplying layer is an undoped InP layer.

* * * * *